United States Patent [19]

Zhou

[11] Patent Number: 6,097,238
[45] Date of Patent: *Aug. 1, 2000

[54] CIRCUIT WITH RAMP-UP CONTROL AND OVERCOMING A THRESHOLD VOLTAGE LOSS IN AN NMOS TRANSISTOR

[75] Inventor: Shi-dong Zhou, Milpitas, Calif.

[73] Assignee: Xilinx, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/782,198

[22] Filed: Jan. 10, 1997

[51] Int. Cl.[7] .................................................. H03K 17/16
[52] U.S. Cl. ........................... 327/390; 327/437; 365/218
[58] Field of Search .................................... 327/387, 389, 327/390, 391, 403, 404, 434, 437, 589; 326/84, 87; 365/189.06, 218

[56] References Cited

U.S. PATENT DOCUMENTS

| | | |
|---|---|---|
| 4,001,606 | 1/1977 | Dingwall . |
| 4,611,135 | 9/1986 | Nakayama et al. ...................... 326/404 |
| 4,731,553 | 3/1988 | Van Lehn et al. ......................... 326/27 |
| 4,825,101 | 4/1989 | Walters, Jr. ............................... 326/87 |
| 5,182,479 | 1/1993 | Behagel et al. ........................... 327/379 |
| 5,563,540 | 10/1996 | Ashley et al. ........................... 327/379 |

OTHER PUBLICATIONS

Neil H. E. Weste and Kamran Eshraghian, "Principles of CMOS VLSI Design, A Systems Perspective", Addison Wesley Publishing Company, reprinted Jun. 1988, Copyright 1985 by AT&T Bell Laboratories and Kamran Eshraghian, pp 38–39.

Primary Examiner—Terry D. Cunningham
Attorney, Agent, or Firm—LeRoy D. Maunu; Edel M. Young

[57] ABSTRACT

A ramping circuit gradually applies an erasing voltage to a memory cell. Within the ramping circuit an NMOS transistor is disclosed which gradually supplies the erasing voltage to the memory cell in response to an external ramping voltage. The NMOS transistor supplies the erasing voltage until the body effect loss voltage of the transistor limits a maximum erasing voltage that the NMOS transistor can supply. The specification then discloses a PMOS transistor which operates to supply the erasing voltage to the memory cell when the NMOS transistor can no longer do so. The PMOS transistor is connected to control circuitry which keeps the PMOS transistor inactive until the output voltage of the NMOS transistor is limited by its body effect voltage loss.

2 Claims, 5 Drawing Sheets

CIRCUIT WITH RAMP-UP CONTROL AND OVERCOMING A THRESHOLD VOLTAGE LOSS IN AN NMOS TRANSISTOR

FIELD OF THE INVENTION

The present invention relates generally to a circuit for overcoming voltage loss in an NMOS transistor, and more particularly to using a controlled PMOS transistor to overcome the voltage loss in an NMOS transistor.

BACKGROUND OF THE INVENTION

NMOS transistors are widely used in integrated circuit applications. One application is in a programmable logic device (PLD), such as a field programmable gate array where voltage passes through an NMOS transistor to erase a flash memory cell. Flash memory cells are erased by gradually applying an erasing voltage to an erase pin on the memory cell.

A drawback to using an NMOS transistor to supply an erasing voltage to a memory cell is that an NMOS transistor does not provide the full input voltage to the memory cell and thus does not "efficiently" erase the memory cell. As is known in the art, the efficiency of a memory cell erasure is defined in terms of a subsequent voltage on the gate of the memory cell required to read the cell. The more efficiently a memory cell is erased, the lower a voltage required to read the memory cell. The less efficiently a memory cell is erased, the higher a voltage required to read the memory cell. The NMOS transistor does not provide the full input voltage to the memory cell, partly because of a "body effect" voltage loss that it experiences. The body effect voltage loss of NMOS transistors is discussed in "Principles of CMOS VLSI Design," by Weste and Eshraghian ©1985, pp. 38–39.

As an example, if a flash memory cell requires 12V at its erase pin for the memory cell to be efficiently erased, then an NMOS transistor receiving an erasing voltage of 12V would be inadequate, since typically the total threshold voltage loss NMOS transistor would limit the voltage seen at the erase pin of the memory cell to only 10.5V.

There have been two main approaches for overcoming the voltage loss of NMOS transistors. A first approach has been to increase the erasing voltage applied to the input of the NMOS transistor. Increasing the erasing voltage, however, increases the chances of dielectric breakdown within the NMOS integrated circuit. While integrated circuit manufacturers could enhance their fabrication processes to reduce the possibility of dielectric breakdown, to do so would increase the price of an integrated circuit.

A second approach has been to replace the NMOS transistor with a PMOS transistor. A PMOS transistor typically does not suffer voltage loss at higher voltages since its source and body are electrically coupled. However, a PMOS transistor unfortunately does not lend itself to controlled and gradual ramping of its output voltage in response to a gradual ramping of its gate voltage. In fact, a PMOS transistor is almost totally off until its gate voltage reaches its threshold voltage, and thereafter is fully on.

What is needed is a circuit that overcomes the voltage loss in an NMOS transistor and which addresses the limitations of the prior art described above.

SUMMARY OF THE INVENTION

The present invention is a circuit that overcomes a voltage loss of an NMOS transistor. Within the circuit of the present invention, a first NMOS transistor receives an input voltage and passes a gradually increasing output voltage in response to a ramping voltage which is applied to the gate of the NMOS transistor. A first PMOS transistor, which also receives the input voltage, is gated by a control circuit. The control circuit receives the ramping voltage, and when the ramping voltage reaches a predetermined voltage level, the control circuit switches on the PMOS transistor. The PMOS transistor then passes the input voltage as the output voltage. Thus, the output voltage passed by the NMOS transistor increases in response to the ramping voltage, and because of the threshold voltage drop of the NMOS transistor, the output voltage passed by the NMOS transistor is less than the input voltage. However, when the PMOS transistor is switched on, the full input voltage is passed by the PMOS transistor as the output voltage.

In another aspect of the invention, the control circuit includes a second PMOS transistor, a clamping circuit, and a second NMOS transistor. The output of the second PMOS transistor gates the first PMOS transistor, the second PMOS transistor being gated by the ramping voltage and receiving the input voltage.

The output of the clamping circuit in combination with the second NMOS transistor also gate the second PMOS transistor. The clamping circuit supplies a voltage that will switch on the second PMOS transistor. The output voltage of the clamping circuit is supplied as the input voltage to the second NMOS transistor, which is gated by the ramping voltage. Thus, when the second PMOS transistor is switched off, the second NMOS transistor is switched on and the voltage from the clamping circuit is supplied to switch on the first PMOS transistor. When the first PMOS transistor is switched on, the full input voltage is supplied as the output voltage.

In still another aspect of the invention, the circuit that overcomes the threshold voltage drop voltage loss of an NMOS transistor is used to supply an erasing voltage to a memory cell. Certain memory cells require a gradual increase in an erasing voltage level, and in addition, require a threshold erasing voltage level. The above described circuit is suitable for erasing such a memory cell because it supplies a gradually increasing output voltage via the first NMOS transistor. When the first PMOS transistor is switched on, the full input voltage is passed as the output voltage to erase the memory cell.

The circuit of the present invention is particularly advantageous over the prior art because the erasing voltage provided to the memory cell is not limited by the threshold voltage drop voltage loss of the NMOS transistor within the circuit.

These and other aspects of the invention will be recognized by those skilled in the art upon review of the detailed description, drawings, and claims set forth below.

DETAILED DESCRIPTION OF THE PREFERRED EMBODIMENT

Figure 1:
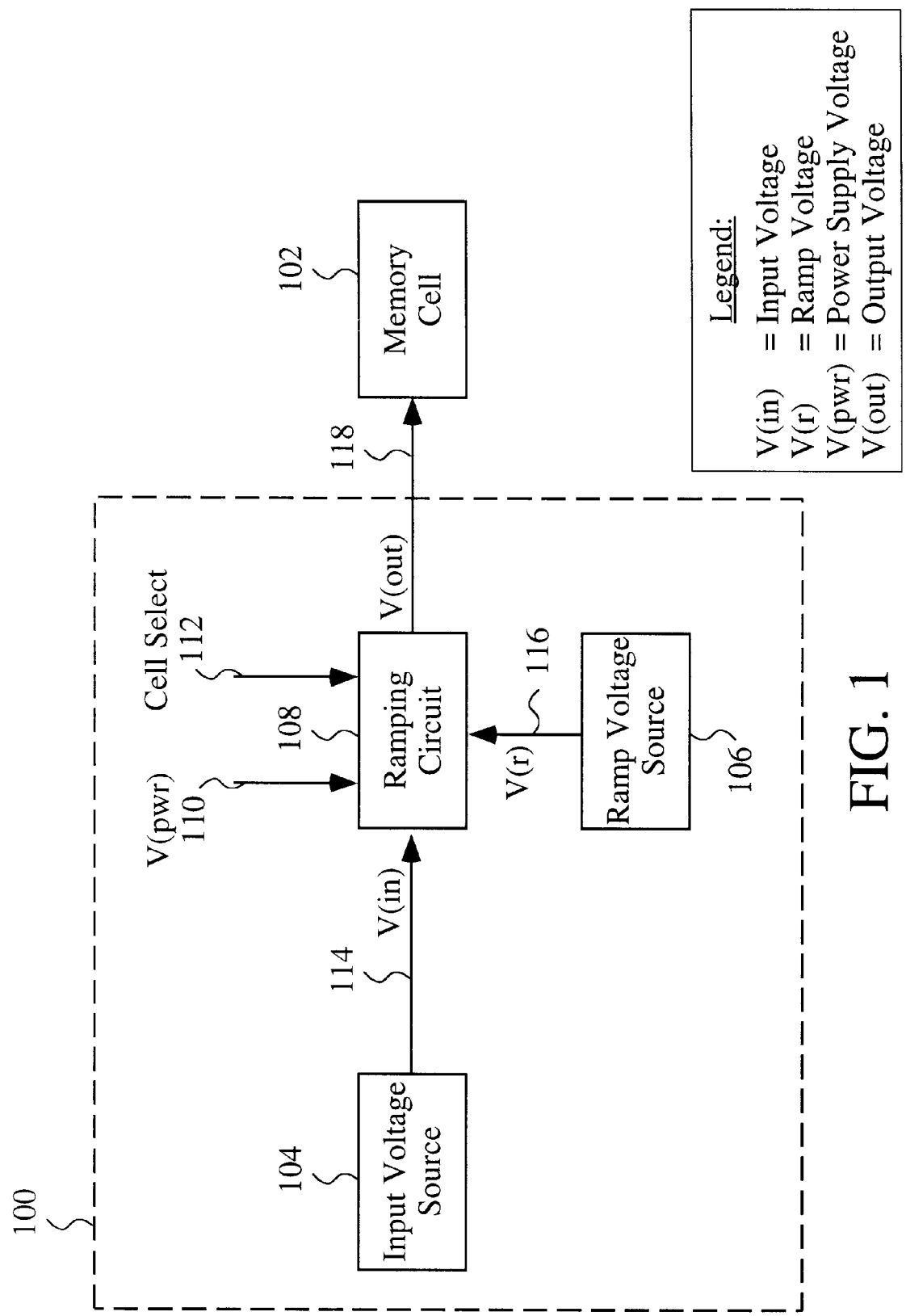
FIG. 1 is a block diagram of a circuit for erasing a memory cell.

FIG. 1 is a block diagram of a circuit 100 for erasing a memory cell 102. The circuit 100 is comprised of an input voltage source 104, a ramp voltage source 106, a ramping circuit 108, a power line 110, and a cell select line 112. The ramping circuit 108 is coupled to the input voltage source 104 over line 114, the ramp voltage source 106 over line 116, the memory cell 102 over line 118. Line 118 couples the output of the ramping circuit 108 to an erase pin of the memory cell 102. The ramping circuit 108 is also coupled to power line 110 and select line 112.

The input voltage source 104 provides an input voltage ($V_{in}$) on line 114. The input voltage is chosen so that the voltage is high enough to erase the memory cell 102 if applied to line 118, but low enough to avoid dielectric breakdown in any of the devices that make up the circuit 100. For example, in a typical Programmable Logic Device (PLD) $V_{in}$ is set to 12V.

The ramp voltage source 106 provides a ramp voltage ($V_r$) on line 116. The ramp voltage is chosen so that the ramping circuit 108 is driven to generate an output voltage ($V_{out}$) on line 118 which ranges from a lowest value when the memory cell 102 is not to be erased to a highest value when the memory cell 102 is to be erased. In a typical circuit 100 implementation for a PLD, $V_r$ ramps from 0V when the memory cell 102 is not to be erased to 12V when the memory cell 102 is to be erased.

The power line 110 carries a power supply voltage ($V_{pwr}$) for powering the ramping circuit 108. Typically, $V_{pwr}$ equals 5V. The cell select line 112 carries a memory cell selection signal for selecting the memory cell 102 for erasing.

The ramping circuit 108 provides a portion of $V_{in}$ to the memory cell 102 via line 118 as $V_{out}$. The portion provided varies in response to $V_r$ if the cell select line 112 has chosen the memory cell 102. The ramping circuit 108 is designed so the $V_{out}$ ranges from a voltage which is too low to erase the memory cell 102, to a voltage that is high enough to erase the memory cell 102. In typical PLD applications $V_{out}$ must range from 0V when the memory cell 102 is not to be erased to 12V when the memory cell 102 is to be erased. To properly erase a memory cell 102 in a PLD, $V_{out}$ must be gradually applied to the erase pin of the memory cell 102. For instance, if $V_{out}$ ranges from 0V to 12V, then most PLDs prefer that $V_{out}$ ramp from 0V to 12V in about 10 ms. More details on the ramping circuit 108 are provided in FIGS. 2 and 4.

Figure 2:
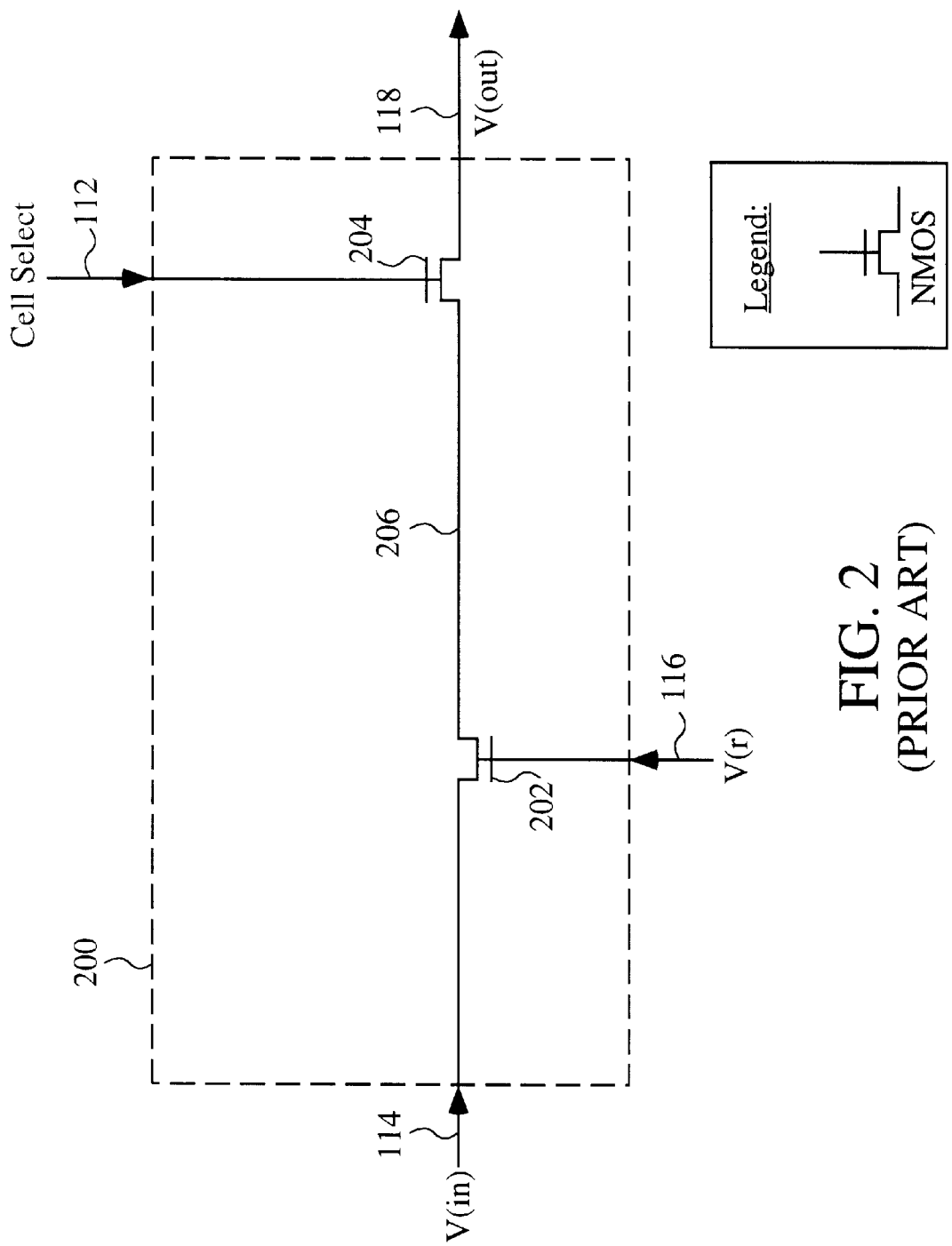
FIG. 2 is a prior art example of a ramping circuit.

FIG. 2 is a prior art example 200 of the ramping circuit 108. The prior art example 200 is comprised of NMOS transistors 202 and 204 and line 206. The NMOS transistors 202 and 204 have respective inputs, outputs, and gates. Line 114 is coupled to the input of transistor 202 and line 116 is coupled to the gate of transistor 202. Line 206 couples the output of transistor 202 to the input of transistor 204. The cell select line 112 is coupled to the gate of transistor 204, and the output of transistor 204 is coupled to line 118.

When the memory cell 102 is not to be erased, no voltage is applied to the cell select line 112, transistor 204 remains off, and the erase pin of the memory cell 102 is held at 0V. When the memory cell 102 is to be erased, a voltage, which is sufficient to turn transistor 204 on, is applied to the cell select line 112, and $V_r$ is ramped through its voltage range. As $V_r$ on line 116 increases, transistor 202 reaches its threshold voltage and then begins to provide an increasing portion of the $V_{in}$ on line 114 to transistor 204 over line 206, and transistor 204 transfers that voltage to line 118 as $V_{out}$.

Thus, as $V_r$ is gradually increased, the NMOS transistor 202 gradually provides a greater portion of the erasing voltage (i.e. $V_{in}$) on to the memory cell 102 and thereby begins to erase the memory cell 102. However, if the memory cell 102 requires 12V for efficient erasure and $V_{in}$ is also 12V, then the combined voltage losses of NMOS transistors 202 and 204 will limit $V_{out}$ to about 10V and the memory cell 102 will not be efficiently erased.

The threshold voltage loss limits a maximum output voltage of an NMOS transistor by increasing its threshold voltage ($V_t$). $V_t$ is the voltage required to turn on the NMOS transistor. As $V_t$ increases the NMOS transistor can only provide a reduced portion of its input voltage as an output voltage as stated by the equation: output voltage≈input voltage−$V_t$. Those skilled in the art will recognize that $V_t$ increases proportionately to the voltage differential between the input and body (i.e. substrate) of the NMOS transistor. Some typical voltage losses for NMOS transistors whose bodies are held at 0V are as follows: if the input voltage to an NMOS transistor is 12V, $V_t$ will be about 1.5V and a maximum output voltage will be about 10.5V.

Returning now to describe the body effect voltage loss relative to the prior art example 200, both NMOS transistors 202 and 204 experience a body effect voltage loss resulting in an increased $V_t$. Using the numbers in the example above, where $V_{in}$=12V, the maximum output voltage of transistor 202 on line 206 will be $V_{in}-V_t$=12V−1.5V=10.5V. However, there is no further voltage drop across NMOS transistor 204 if the gate of the transistor 204 is held at 12V, thus the maximum output voltage of transistor 204 on line 118 will remain the same as the voltage on line 206 (i.e. 10.5V).

Figure 3A:
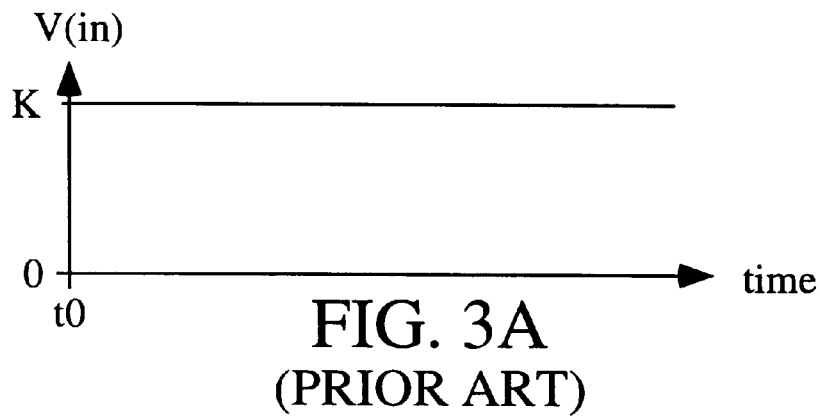
FIGS. 3A, 3B and 3C are graphs of a set of prior art stimulus and response curves for the prior art ramping circuit of FIG. 2.
Figure 3B:
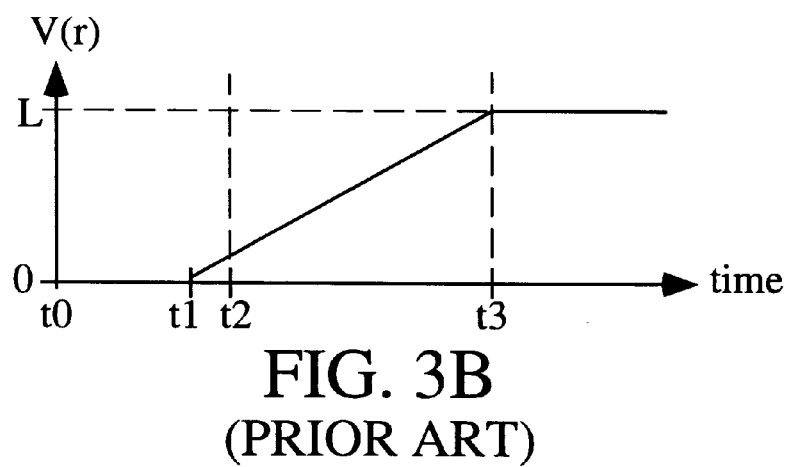
Figure 3C:
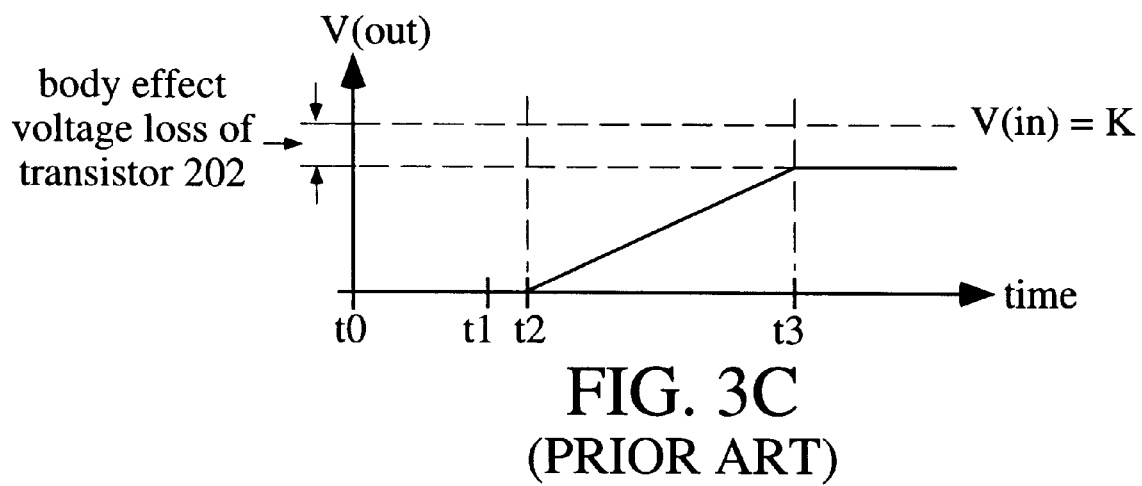

FIGS. 3A, 3B and 3C are graphs of a set of prior art stimulus and response curves for the prior art ramping circuit of FIG. 2. The stimulus and response curves illustrate the relationships between the various voltage levels that appear in the prior art example 200 of FIG. 2 as $V_r$ is ramped from 0V to a predetermined voltage level. The predetermined voltage level is selected based on the requirements of the memory cell 102.

FIG. 3A is a graph of an exemplary $V_{in}$ over time. $V_{in}$ is equal to a constant K in this example. K is a voltage required at the erase pin (i.e. line 118) of the memory cell 102 in order for the memory cell 102 to be erased. For flash memory erasures, K is typically set to 12V.

FIG. 3B is a graph of an exemplary $V_r$ over time. $V_r$ is 0V at time $t_1$ and ramps up to L at time $t_3$ in this example. L is a voltage applied to the gate of the NMOS transistor 202 and is sufficiently large to reach a voltage where the transistor 202 provides a largest voltage from line 114 to line 206. L is also typically set to 12V. Time $t_2$ will be discussed with reference to FIG. 3C.

FIG. 3C is a graph of $V_{out}$ over time. $V_{out}$ is the voltage on line 118 which will erase the memory cell 102 (see FIG. 1). $V_{out}$ must reach K (see FIG. 3A) to efficiently erase the memory cell 102. From times $t_1$ to $t_2$ transistor 202 has not yet turned on, even though $V_r$ has been ramping upward. Thus, Vout stays at 0V. At time $t_2$, transistor 202 turns on and begins to provide a $V_{out}$ voltage. From times $t_2$ through $t_3$ $V_{out}$ gradually ramps closer to K as current is provided through transistors 202 and 204. However, at time $t_3$, $V_r$ reaches its maximum voltage (i.e. L) and $V_{out}$ levels off. $V_{out}$ levels off at less than K due to the voltage loss of transistor 202. In this prior art circuit, $V_{out}$ is thus limited to a voltage of K minus the voltage loss of transistor 202. As a result, the prior art example 200 does not provide K to the memory cell 102, and the memory cell is not efficiently erased.

Figure 4:
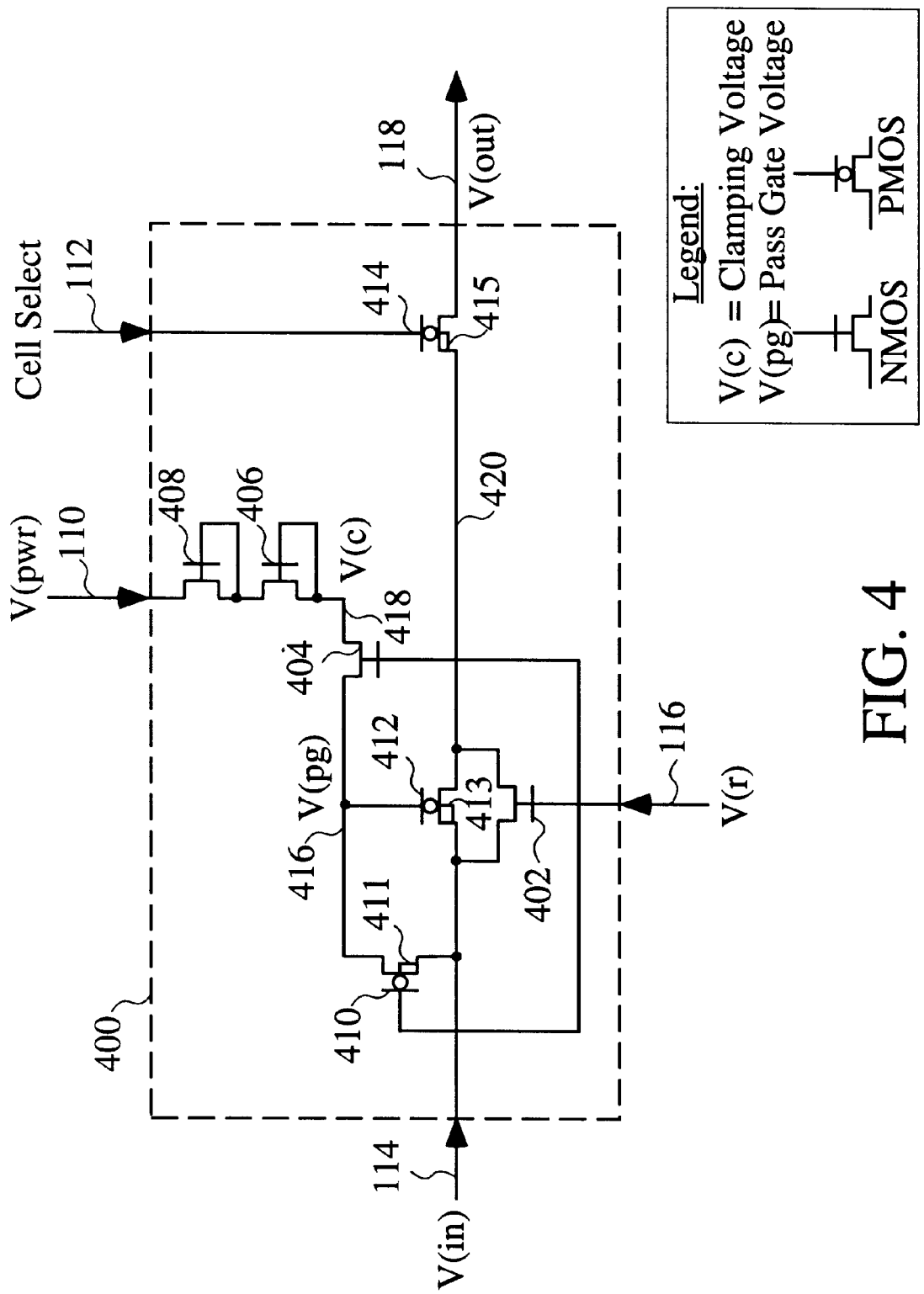
FIG. 4 is a diagram of a circuit for overcoming a voltage loss in an NMOS transistor in place of a ramping circuit in FIG. 1.

FIG. 4 is a diagram of a circuit 400 for overcoming a voltage loss in an NMOS transistor in place of the ramping circuit 108 in FIG. 1. The ramping circuit 400 is comprised of NMOS transistors 402, 404, 406 and 408, and PMOS transistors 410, 412 and 414. Each transistor, as is well known in the art, is comprised of a gate, a source, a drain and a body.

Each PMOS transistor 410, 412, 414 has its source electrically coupled to its body by jumper lines 411, 413, 415 which function so as to eliminate any voltage loss within the PMOS transistors 410, 412, 414. In contrast, the NMOS transistors 402, 404, 406, 408 have their bodies coupled to ground (i.e. 0V) and thus experience the voltage loss discussed above.

Line 116 from the ramp voltage source 106 (see FIG. 1) is coupled to the gates of transistors 402, 404 and 410. Line 114 from the input voltage source 104 is coupled to the inputs of transistors 402 and 410. Line 416 couples the output of transistor 410, the gate of transistor 412, and the input of transistor 404. The voltage appearing on line 416 is called the "pass gate voltage" ($V_{pg}$) since transistor 412 may alternately be called a pass transistor, and line 416 is connected to the gate of the pass transistor. Line 418 couples the output of transistor 404 to the input of transistor 406. Transistors 406 and 408 have their gates coupled to their inputs and are coupled to each other. The output of transistor 408 is coupled to power line 110. The combination of transistors 406 and 408 clamp the voltage on line 418 to a clamping voltage ($V_c$). Line 420 couples the outputs of transistors 402 and 412 to the input of transistor 414. The gate of transistor 414 is coupled to the cell select line 112, and its output is coupled to the erase pin of the memory cell 102 via line 118.

The operation of the circuit 400 is described below. In the following discussion, a transistor which is in an "on" state is a transistor acting as a switch which is closed, and a transistor which is in an "off" state is a transistor acting as a switch which is open. However, due to the well known nature of MOS transistors, intermediate states which are between on and off also exist and are discussed where appropriate. Also, each of the MOS transistors within the circuit 400 are chosen such that they behave in the manner described below. As is well known in the art, MOS transistors can be chosen with a variety of voltage thresholds and transfer characteristics.

The memory cell 102 is selected by applying a voltage to cell select line 112 sufficiently low to cause transistor 414 to turn on so that the voltages on lines 420 and 118 are equal. Since transistor 414 is a PMOS transistor with its body and input electrically coupled by line 415, all of the voltage (above the threshold voltage of transistor 414) appearing at the input of transistor 414 is provided to line 118 without suffering from any voltage loss.

The ramping voltage ($V_r$), starting at a value of 0V, is applied to line 116. When $V_r$ is at 0V the voltage on line 116 is below the threshold voltages of transistors 402 and 404. As a result transistors 402 and 404 are off and transistor 410 is on. When transistor 410 is on, $V_{in}$ is provided to the gate of transistor 412 via line 416, and transistor 412 stays off. Since both transistors 402 and 412 are off, $V_{out}$=0V.

As $V_r$ ramps higher it reaches the threshold voltage of transistor 402 and a portion of $V_{in}$ is provided from line 114 to line 420 to become $V_{out}$. The threshold of transistor 402 is selected to be below the threshold voltages of transistors 404 and 410, and thus, transistor 410 stays on and transistor 404 is temporarily off. As $V_r$ ramps even higher, the portion of $V_{in}$ provided by transistor 402 proportionally increases.

At approximately the voltage level where the output voltage of transistor 402 begins to be limited by its threshold voltage, $V_r$ reaches the thresholds of transistors 404 and 410. As a result, transistor 410 begins to turn off and thus provides less and less of $V_{in}$ as $V_{pg}$ on line 416 to transistor 412. Also as $V_r$ increases, transistor 404 begins to turn on and slowly pulls down $V_{pg}$ on line 416 to the clamping voltage ($V_c$) on line 418. $V_c$ is chosen so that when $V_{pg}$=$V_c$ transistor 412 will turn on. When transistor 412 turns on, $V_{in}$ is provided directly to line 420 and $V_{out}$=$V_{in}$. Since $V_{out}$=$V_{in}$ the circuit 400 of FIG. 4 overcomes the voltage loss of transistor 402.

FIGS. 5A, 5B, 5C and 5D are graphs of a set of stimulus and response curves for the ramping circuit of FIG. 4. The stimulus and response curves illustrate the relationships between the various voltage levels that appear in the circuit 400 of FIG. 4 as $V_r$ is ramped from 0V to a predetermined voltage level. The predetermined voltage level is selected based on the requirements of the memory cell 102.

Figure 5A:
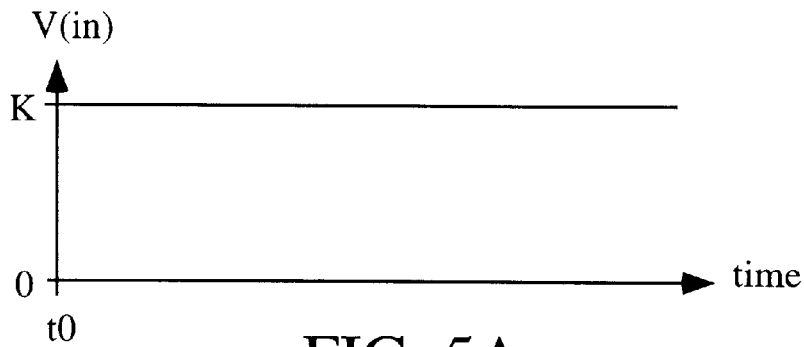
FIGS. 5A, 5B, 5C and 5D are graphs of a set of stimulus and response curves for the ramping circuit of FIG. 4.

FIG. 5A is a graph of an exemplary $V_{in}$ over time. $V_{in}$ is equal to a constant K in this example. K is a voltage required at the erase pin (i.e. line 118) of the memory cell 102 in order for the memory cell 102 to be efficiently erased. For example, K may be set to 12V.

Figure 5B:
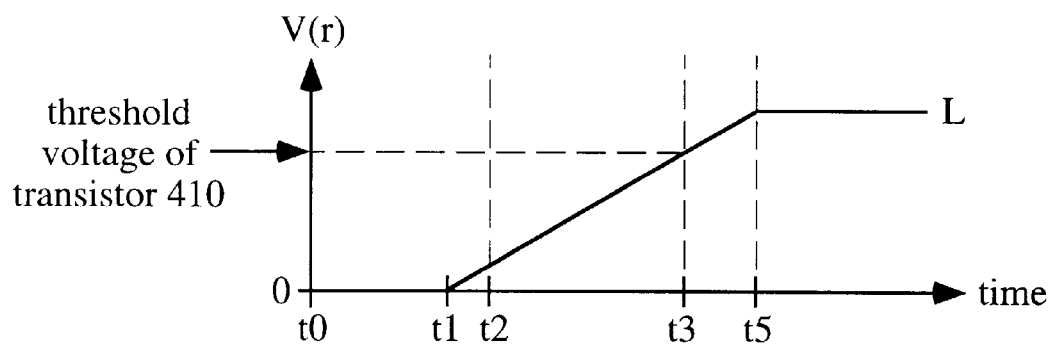

FIG. 5B is a graph of an exemplary $V_r$ over time. $V_r$ is 0V at time $t_1$ and ramps up to L at time $t_5$ in this example. L is a voltage applied to the gate of the NMOS transistor 402 and is sufficiently large to exceed a voltage where the transistor 402 provides a greatest voltage from line 114 to line 420, to turn transistor 410 off, and to turn transistor 404 on. At time $t_3$ transistor 410 reaches its threshold voltage and begins to turn off as will be discussed further with respect to FIG. 5C.

Figure 5C:
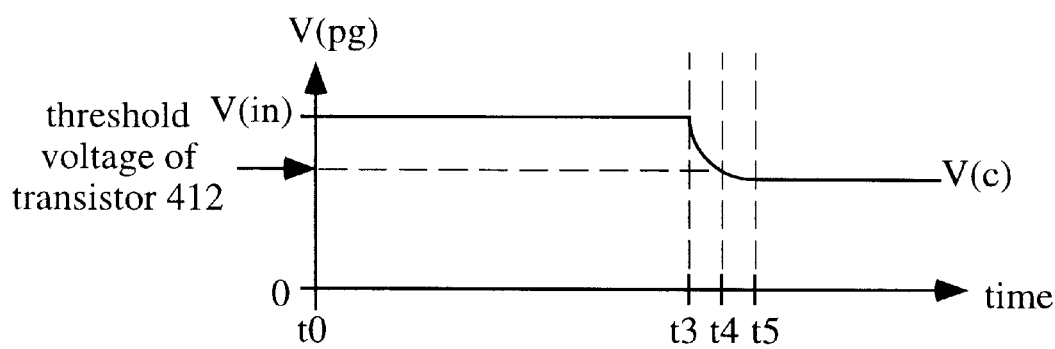

FIG. 5C is a graph of an exemplary pass gate voltage ($V_{pg}$) over time. As shown in the figure, from $t_0$ through $t_3$ the voltage on line 416 remains equal to $V_{in}$ since transistor 410 is on. At $t_3$1 transistor 410 reaches its threshold voltage and begins to turn off. During the time period $t_3$ through $t_5$ $V_{in}$ is no longer supplied to line 416, and $V_{pg}$ begins to fall. At about the same time as transistor 410 begins to turn off, transistor 404 begins to turn on. As transistor 404 turns on, $V_{pg}$ is pulled down to the clamping voltage ($V_c$) on line 418. As $V_{pg}$ is pulled down toward $V_c$, it eventually reaches the threshold voltage of transistor 412 at time $t_4$.

Figure 5D:
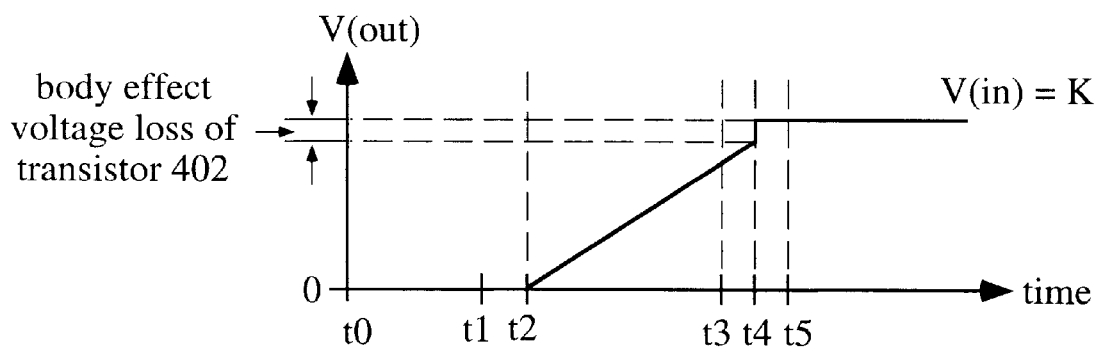

FIG. 5D is a graph of $V_{out}$ over time. $V_{out}$ is the voltage on line 118 which will erase the memory cell 102. $V_{out}$ must reach K (see FIG. 5A) to efficiently erase the memory cell 102. From times $t_1$ to $t_2$1 the NMOS transistor 402 has not yet reached its threshold voltage even though $V_r$ has been ramping upward. Thus, $V_{out}$ stays at 0V. At time $t_2$, transistor 402 reaches its threshold voltage and thus turns on and begins to provide a $V_{out}$ voltage. From times $t_2$ through $t_4$1 $V_{out}$ gradually ramps closer to K as current is provided through transistor 402. However, at time $t_4$, $V_r$ begins to reach its maximum voltage (i.e. L) but $V_{out}$ is still not equal to K due to the voltage loss of transistor 402. However by design, transistor 412 begins to turn on at time $t_4$. Once transistor 412 turns on it provides $V_{in}$ to line 420 so $V_{out}$ $V_{in}$. As a result, at a time shortly after $t_4$ the circuit 400 provides K to the memory cell 102 and the memory cell is efficiently erased. While it is important that $V_{out}$ rise gradually toward K, those skilled in the art will recognize that the small voltage jump shown right after time $t_4$ in FIG. 5D will not unduly stress the memory cell 102.

While the present invention has been described with reference to a preferred embodiment, those skilled in the art will recognize that various modifications may be made.

Variations upon and modifications to the preferred embodiment are provided by the present invention, which is limited only by the following claims.

What is claimed is:

1. A circuit for overcoming a body effect voltage loss in an NMOS transistor, comprising:

a first NMOS transistor, having an input terminal coupled to receive an input voltage, a gate coupled to receive a ramp voltage, and an output terminal for providing an output voltage, the NMOS transistor providing a varying portion of the input voltage to the output terminal in response to variations in the ramp voltage;

a control circuit comprising a second NMOS transistor having a gate coupled to receive the ramp voltage and an input terminal connected to receive an intermediate voltage having a voltage level between ground and the input voltage, for providing the intermediate voltage after the ramp voltage reaches a predetermined voltage;

a first PMOS transistor, having an input terminal coupled to receive the input voltage, a gate coupled to receive the intermediate voltage from the control circuit, and an output terminal coupled to the output terminal of the first NMOS transistor for providing an output voltage, the first PMOS transistor providing the input voltage to the output terminal in response to presence of the intermediate voltage at its gate;

the control circuit further comprising a second PMOS transistor having an input terminal coupled to receive the input voltage, a gate coupled to receive the ramp voltage, and an output coupled to the gate of the first PMOS transistor, the second PMOS transistor providing the input voltage to the gate of the first PMOS transistor before the ramp voltage reaches the predetermined voltage and not providing the input voltage to the gate of the first PMOS transistor after the ramp voltage reaches the predetermined voltage;

a clamping circuit for providing the intermediate voltage; and the second NMOS transistor having an output terminal coupled to the gate of the first PMOS transistor, the second NMOS transistor preventing the intermediate voltage from reaching the gate of the first PMOS transistor before the ramp voltage reaches the predetermined voltage and providing the intermediate voltage to the gate of the first PMOS transistor after the ramp voltage reaches the predetermined voltage.

2. A memory cell circuit arrangement comprising:

a first NMOS transistor, having an input terminal coupled to receive an input voltage, a gate coupled to receive a ramp voltage, and an output terminal for providing an output voltage, the NMOS transistor providing a varying portion of the input voltage to the output terminal in response to variations in the ramp voltage;

a control circuit coupled to receive the ramp voltage, for providing an intermediate voltage having a voltage level between ground and the input voltage after the ramp voltage reaches a predetermined voltage;

a first PMOS transistor, having an input terminal coupled to receive the input voltage, a gate coupled to receive the intermediate voltage from the control circuit, and an output terminal coupled to the output terminal of the NMOS transistor for providing an output voltage, the first PMOS transistor providing the input voltage to the output terminal in response to presence of the intermediate voltage at its gate; and the control circuit further comprising a second PMOS transistor having an input terminal coupled to receive the input voltage, a gate coupled to receive the ramp voltage, and an output coupled to the gate of the first PMOS transistor, the second PMOS transistor providing the input voltage to the gate of the first PMOS transistor before the ramp voltage reaches the predetermined voltage and not providing the input voltage to the gate of the first PMOS transistor after the ramp voltage reaches the predetermined voltage;

a clamping circuit for providing the intermediate voltage;

the second NMOS transistor having an output terminal coupled to the gate of the first PMOS transistor, the second NMOS transistor preventing the intermediate voltage from reaching the gate of the first PMOS transistor before the ramp voltage reaches the predetermined voltage and providing the intermediate voltage to the gate of the first PMOS transistor after the ramp voltage reaches the predetermined voltage; and a memory cell coupled to receive the output voltage.

* * * * *